United States Patent
Sklebitz et al.

[11] Patent Number: 6,080,979
[45] Date of Patent: Jun. 27, 2000

[54] TRANSDUCER SENSITIVE TO RADIATION

[75] Inventors: Hartmut Sklebitz, Erlangen; Tom Weidner, Nuremberg, both of Germany

[73] Assignee: Siemens Aktiengesellschaft, Munich, Germany

[21] Appl. No.: 09/038,061

[22] Filed: Mar. 11, 1998

[30] Foreign Application Priority Data

Mar. 17, 1997 [DE] Germany ............... 197 10 958

[51] Int. Cl.⁷ ................................ H01L 27/146
[52] U.S. Cl. .................... 250/214.1; 250/208.1; 250/214 R; 257/431
[58] Field of Search ............... 250/214.1, 214 R, 250/208.1; 257/431, 464, 469

[56] References Cited

U.S. PATENT DOCUMENTS 4,729,165  3/1988  Fahrenschon ............... 29/846
4,775,895  10/1988  Traupe et al. ............... 358/482
4,810,881  3/1989  Berger et al. ............... 250/370.01
5,298,742  3/1994  Friauf et al. ............... 250/239

FOREIGN PATENT DOCUMENTS

PS 195 46 423  2/1997  Germany .

*Primary Examiner*—John R. Lee
*Attorney, Agent, or Firm*—Hill & Simpson

[57] ABSTRACT

A transducer sensitive to electromagnetic radiation has a substrate with printed conductor runs arranged on both sides, a sensor that is sensitive to radiation glued over a large surface at the front side of the substrate, and of a thermal expansion-compensating "dummy" component connected to the back side of the substrate. The printed conductor runs have connections to one another only in the middle region of the substrate, and otherwise are free of intersections. The basic orientation of the conductor runs can be stellate or right-angled. The absence of conductor run intersections allows gas to escape during the gluing process, so that gas pockets do not form in the adhesive, which can degrade the quality of the adhesive connection.

9 Claims, 3 Drawing Sheets

TRANSDUCER SENSITIVE TO RADIATION

BACKGROUND OF THE INVENTION

1. Field of the Invention

The present invention is directed to a radiation-sensitive transducer of the type having a sensor disposed on one side of a substrate having printed conductor runs therefor, with the sensor being glued over a large surface area on this side of the substrate. As used herein, a radiation-sensitive transducer means a transducer which converts incoming electromagnetic radiation into an electrical signal (current).

2. Description of the Prior Art

Monocrystalline light-sensitive sensors (e.g. CCDs or photodiode arrays) must often be of large-area construction and fastened to a mounting plate. From the mounting plate, the electrical connection of the sensor and the mechanical fastening in the system can ensue. For this purpose, the sensor is usually connected fixedly to the mounting plate (e.g. glued). When temperature variations occur, the surface of the sensor forms a bend (in the case of a one-dimensional (strip) sensor) or a spherical surface (in the case of a two-dimensional sensor). This can make the coupling to an optical (e.g. fiber optical) system or to an image converter (e.g. scintillator) more difficult, and can lead to loss of light or sensitivity, or MTF loss, in the regions wherein an enlarged coupling gap exists.

For these reasons, in German OS 195 46 423, corresponding to U.S. application Ser. No. 08/740,489, filed Oct. 30, 1996, now abandoned, ("Radiation Sensitive Transducer Wherein Deformation Due to Temperature Fluctuations Is Avoided," Sklebitz et al., assigned to the same assignee as the present application), a radiation-sensitive transducer is disclosed in which, in order to avoid the unwanted formation of a spherical CCD surface, during packaging a radiation-sensitive sensor is glued over a large surface to the front side of a mounting plate (i.e., a substrate), and a large-surface "dummy" component with approximately the same dimensions and the same thermal expansion behavior as the sensor is glued to the back side. By means of these measures, a problem-free coupling to a flat fiber optic plate is achieved.

For the manufacturing of a CCD ceramic Si dummy sandwich of this sort, relatively large-surface gluings are required, in which it cannot be avoided that gas pockets arise during the gluing that have an adverse effect on the quality of the gluing.

In order to achieve the symmetry required for both sides of the ceramic substrate (which may consist of other materials), the conductor runs are printed on the ceramics in the standard manner for hybrid technology and are constructed with approximately the same surface and directionality as the runs on the opposite side. These printed conductor runs are slightly raised in relation to the level of the substrate surface (e.g. by about 10 microns). Since in general two planes (levels) of printed conductors are employed, gas volumes become trapped in this recess at the ceramic substrate surface by the adhesive film which is applied thereover, during the thermal softening of the film-type adhesive for the beginning of the adhesion process. These gas volumes (inclusions) prevent an optimal adhesion of the glue in this area.

SUMMARY OF THE INVENTION

An object of the present invention is to provide a radiation-sensitive transducer of the type described above wherein the aforementioned gas pockets are prevented or are at least reduced to a tolerable level, so that an optimal adhesion of the glue is provided.

This object is inventively achieved in a radiation-sensitive transducer having that printed conductor runs with connections to one another only in the middle region of the substrate, and are otherwise printed without intersections. Due to the intersection-free printing of the conductor runs, gases can escape, so that the adhesive adheres over the entire surface.

It has proven advantageous if the printed conductors are laid in stellate (i.e., radiating) or right-angled form, with partial segments of the printed conductors in the main axes having other angles, and the right angles of the printed conductors can be arranged essentially in the region of the diagonals of the substrate. By means of the stellate or right-angled basic orientation of the printed conductors, it is ensured that no printed conductor intersections occur.

A deformation of the sandwich arrangement is avoided if the printed conductors on both sides of the substrate are constructed symmetrically as far as possible, and the dummy component, likewise connected over a large surface at the back side of the substrate, can have approximately the same dimensions and thermal expansion behavior as the sensor.

Both sides of the conductor can advantageously be constructed with the same surface occupancy and the same directionality with printed conductors of a particular orientation, without any printed conductor intersections.

DESCRIPTION OF THE PREFERRED EMBODIMENTS

Figure 1:
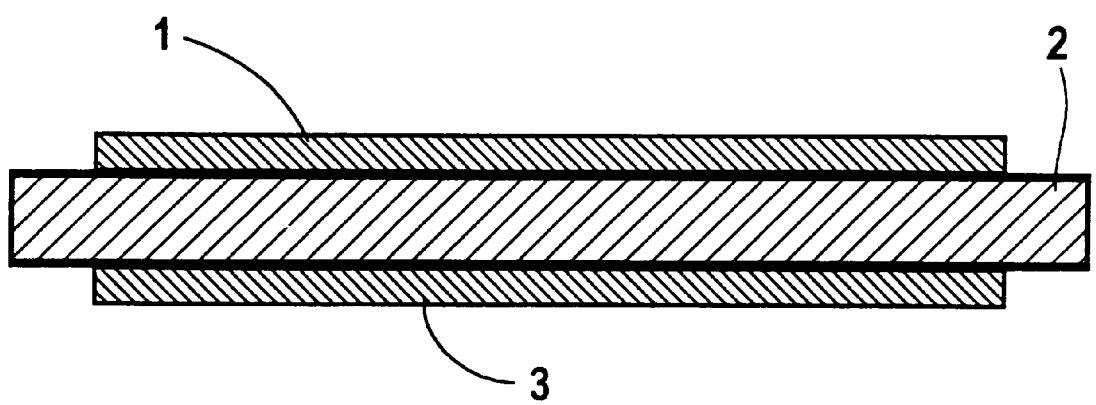
FIG. 1 is aside sectional view of a radiation-sensitive transducer constructed in accordance with the principles of the present invention.

FIG. 1 shows a semiconductor sensor 1 that is attached to the front side of a substrate 2 as a mounting plate. The sensor 1 converts incoming electromagnetic radiation into electrical signals (current). On the back side of the substrate 2, which can, for example, consist of a ceramic material, an equally large, approximately equally thick component 3 of the same material as the semiconductor sensor 1 is arranged in the same position and is connected with the substrate 2 using the same adhesive.

The resulting sandwich arrangement makes deformation during temperature changes impossible, because tensile or pressure forces exerted on the substrate 2 by the semiconductor sensor 1 are compensated by exactly equal forces of the component 3 from the back side of the substrate 2.

Figure 2:
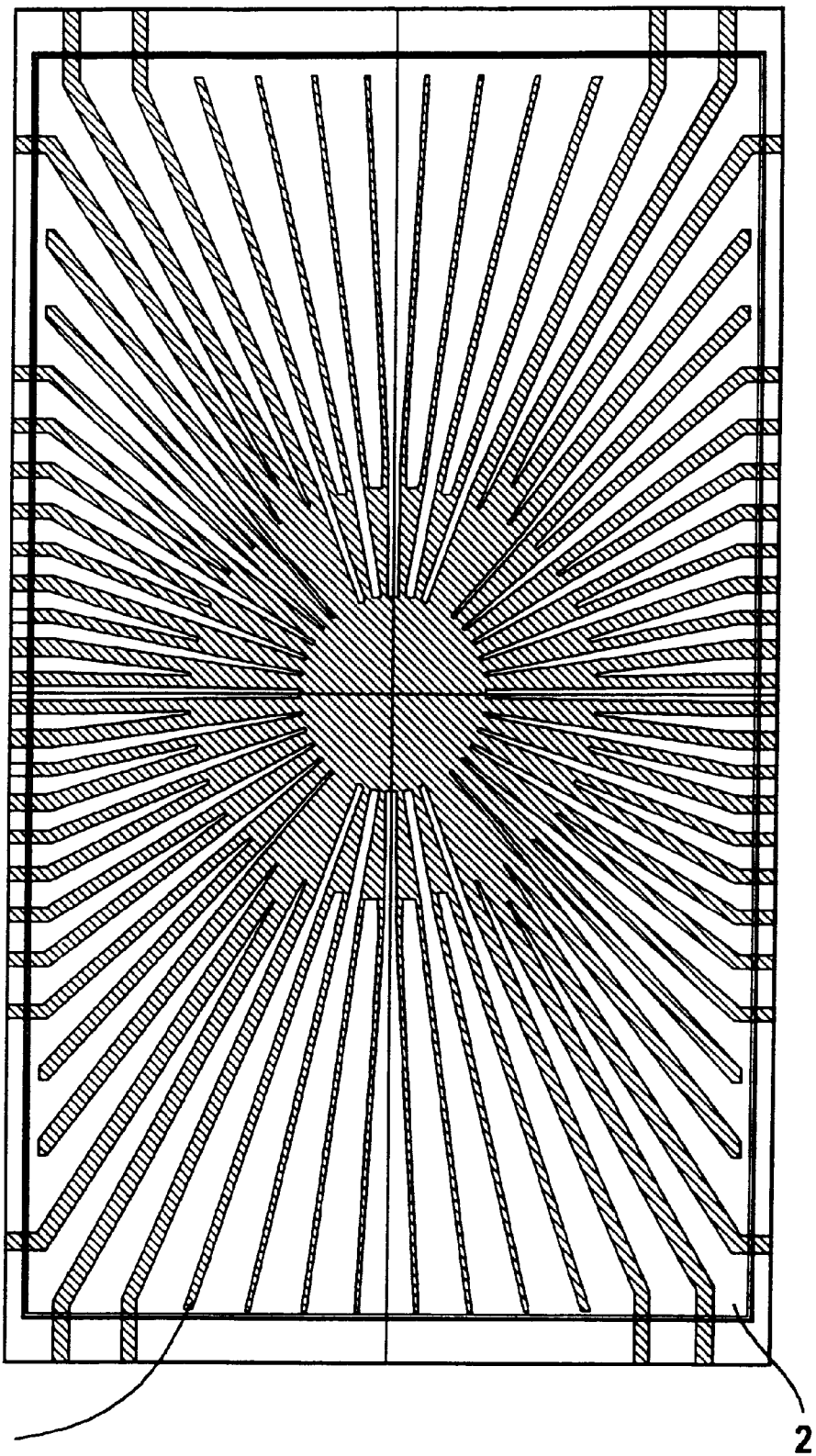
FIG. 2 is a plan view of the front side of the transducer of FIG. 1, with the sensor removed, showing a first embodiment of the configuration of the conductor runs.

FIG. 2 shows a first exemplary embodiment, in which printed conductors 4 run outwardly in stellate fashion from the center of the substrate 2. In this way, it is ensured that the printed conductor runs 4 are laid without intersection. Since, however, the printed conductor runs 4 on the other side of the substrate 2 are generally laid in right-angled form, and do not run at an arbitrary angle, an arrangement of this sort is excellent with respect to the prevention of gas pockets, but the compensation of the thermal stresses by the conductor paths is not optimal.

Figure 3:
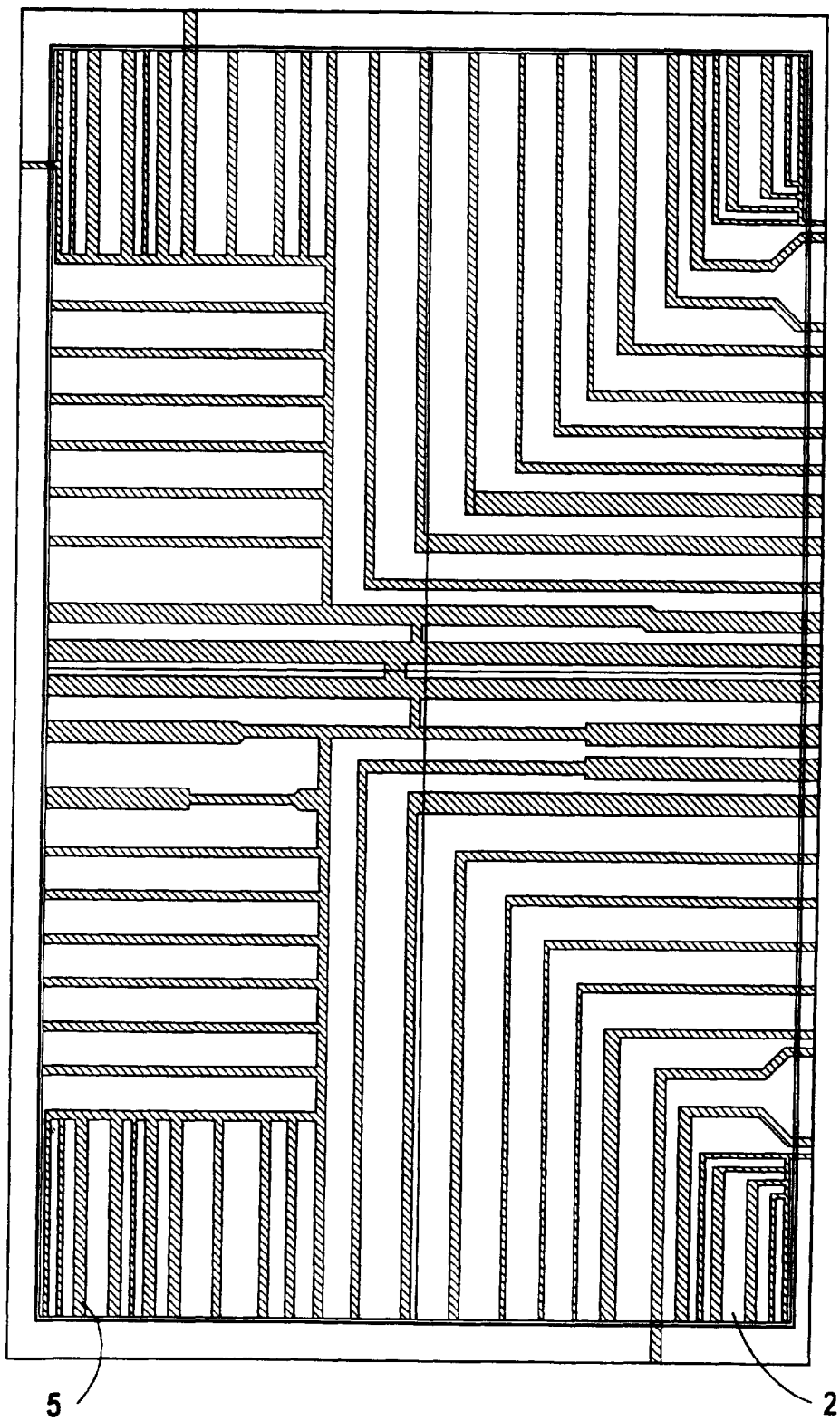
FIG. 3 is a plan view of the front side of the transducer of FIG. 1, with the sensor removed, showing a second embodiment of the configuration of the conductor runs.

FIG. 3 shows a further exemplary embodiment in which the printed conductor runs 5 are laid in right-angled form in such a way that the printed conductor runs 5 meet the outer edges perpendicularly. This is achieved by arranging the right angles substantially in the regions of the diagonals of the substrate 2. Within the conductor segments between the diagonals, sections of the printed conductor runs 5 can have other angles (i.e., non-90° angles). By means of this arrangement, the substrate 2 can have both the same surface occupancy as the opposite side and also can have the same printed conductor run orientations as on the opposite side. This design will exhibit better flatness over temperature fluctuations.

By means of the avoidance of all printed conductor intersections which may cause a gas pocket in the design of the printed conductor tensions, one obtains—both horizontally and vertically—surface occupancies equal or similar to those on the other side of the ceramic substrate 2, and occupancy by printed conductors 4 and 5 of a particular orientation equal to that on the other side of the ceramic substrate 2. Due to the absence of printed conductor intersections, the gas can escape unhindered from the sandwich, so that problem-free adhesions result due to the evacuation of the adhesive surface.

Although modifications and changes may be suggested by those skilled in the art, it is the intention of the inventors to embody within the patent warranted hereon all changes and modifications as reasonably and properly come within the scope of their contribution to the art.

We claim as our invention:

1. A radiation-sensitive transducer comprising:
   a substrate having a surface with a central region and edges spaced a distance from said central region;
   a plurality of neighboring printed conductor runs on said surface of said substrate proceeding from said central region to said edges;
   a sensor which is sensitive to radiation glued over said conductor runs covering a large area of said surface of said substrate including said central region and at least a portion of said distance; and
   said neighboring printed conductor runs comprising connections to each other only in said central region of said substrate, and otherwise having no intersections with each other to leave unimpeded gas escape passages between said neighboring printed conductor runs, said passages proceeding from said central region to said edges of said substrate.

2. A transducer as claimed in claim 1 wherein said printed conductor runs are printed on said surface of said substrate in a stellate arrangement.

3. A transducer as claimed in claim 1 wherein said printed conductor runs are printed on said surface of said substrate in a right-angled arrangement.

4. A transducer as claimed in claim 3 wherein said printed conductor runs comprise segments extending between right-angles, and wherein said printer conductor runs in said segments exhibit angles other than right-angles.

5. A transducer as claimed in claim 3 wherein said substrate has diagonals extending between opposite corners of said substrate, and wherein said printed conductor runs have right-angles disposed substantially on said diagonals.

6. A transducer as claimed in claim 1 wherein said substrate has a further surface, opposite said surface, wherein said plurality of conductor runs on said surface comprise a first set of conductor runs, and said transducer further comprising a second set of conductor runs disposed on said further surface, said first and second sets of conductor runs being oriented symmetrically on the respective surface and further surface of said substrate.

7. A transducer as claimed in claim 6 further comprising a component glued on said further surface of said substrate over a portion of said second set of conductor runs, said component having a thermal expansion behavior substantially equal to thermal expansion behavior of said sensor.

8. A transducer as claimed in claim 6 wherein said first and second sets of conductor runs have substantially a same occupancy and directionality on the respective surface and further surface.

9. A radiation-sensitive transducer comprising:
   a substrate having a front surface with a central region and edges spaced a distance from said central region;
   a plurality of neighboring printed conductor runs on said front surface proceeding from said central region to said edges;
   a sensor glued over said conductor runs covering a large area of said front surface of said substrate including said central region and at least a portion of said distance;
   a component connected to said back surface of said substrate; and
   said plurality of neighboring printed conductor runs on said front surface having connections to each other only in said central region of said substrate, and otherwise having no intersections with each other to leave unimpeded gas escape passages between said neighboring printed conductor runs, said passages proceeding from said central region to said edges of said substrate.

* * * * *